United States Patent [19]

Chu et al.

[11] Patent Number: 4,544,576
[45] Date of Patent: Oct. 1, 1985

[54] DEEP DIELECTRIC ISOLATION BY FUSED GLASS

[75] Inventors: Wei-Kan Chu; William A. Pliskin; Jacob Riseman, all of Poughkeepsie, N.Y.

[73] Assignee: International Business Machines Corporation, Armonk, N.Y.

[21] Appl. No.: 287,466

[22] Filed: Jul. 27, 1981

[51] Int. Cl.⁴ .............................................. H01L 21/76
[52] U.S. Cl. .................................. 427/82; 29/576 W; 156/643; 427/93; 427/95; 427/240; 427/96
[58] Field of Search ...................... 427/93, 82, 96, 95, 427/240; 156/643; 29/576 W

[56] References Cited
U.S. PATENT DOCUMENTS

| 4,019,248 | 4/1977 | Black .............................. 29/576 W |
| 4,039,702 | 8/1977 | Di Bugnara ......................... 427/93 |
| 4,140,558 | 2/1979 | Murphy ........................... 29/576 W |
| 4,202,916 | 5/1980 | Chadda ............................... 427/93 |
| 4,222,792 | 9/1980 | Lever ................................. 427/93 |
| 4,356,211 | 10/1982 | Riseman ............................. 427/93 |
| 4,404,736 | 9/1983 | Koshino .......................... 29/576 W |

Primary Examiner—John D. Smith
Attorney, Agent, or Firm—Sughrue, Mion, Zinn, Macpeak, and Seas

[57] ABSTRACT

Deep dielectric isolation zones in a substrate are achieved by forming trenches using reactive ion etching. A glass having a coefficient of thermal expansion closely matching that of the substrate is deposited onto the trench to entirely or partially fill the trench. Deposition can be by sedimentation, centrifugation or spin-on techniques. The structure is then fired until the glass particles fuse into a continuous glass layer and final smoothing if necessary can be accomplished.

14 Claims, 6 Drawing Figures

DEEP DIELECTRIC ISOLATION BY FUSED GLASS

BACKGROUND OF THE INVENTION

This invention relates to methods for dielectrically isolating regions in a VLSI structure to electrically separate devices and to increase semi-conductor device packing density. This invention also relates to the resulting deep dielectric isolation zone structure formed as a result of the practice of the method herein.

DESCRIPTION OF THE PRIOR ART

In integrated circuit technology, and in particular, large scale integration (LSI) and very large scale integration (VLSI) fabrication, it is necessary to isolate various active and passive elements from each other in the integrated circuit structure. A number of approaches in the prior art have been attempted to isolate electrical elements which form the integrated circuit. It is understood, that as used herein, the term integrated circuit means thin film integrated circuits as well as semi-conductor monolithic and hybrid integrated circuits. The techniques that have been employed include isolation by back-biasing PN junctions, partial dielectric isolation and complete dielectric isolation. Increasing device packing density in the context of VLSI devices and improving electrical isolation are important areas of continuing research. Reference is made to Bean and Runyan, "Dielectric Isolation: Comprehensive, Current and Future", *J. Electrochem. Soc.*, 124, 5 (1977), that reviews various prior art dielectric isolation techniques and discusses the problems associated with each.

A known form of dielectric isolation utilizes the formation of grooves or depressions in silicon where the isolation regions are to be formed. During the step of groove formation, the remainder of the silicon substrate surface is covered by a protective film but not affected by the etch used to form the grooves. Typically, following etching, the substrate is subjected to a conventional oxidation step where the entire groove area is oxidized with the silicon dioxide filling up the groove as well as oxidizing further into the silicon to form the isolation region. A major problem with this known prior art technique is the formation of a "bird's beak", a non-planar silicon dioxide formation at the top periphery of the groove. In addition, there is concern about the depth of isolation and the electrical characteristics of the isolation.

Reference is made to U.S. Pat. No. 4,104,086 which describes methods of forming dielectric isolated structures utilizing substantially vertical isolation trenches which are filled either by thermal oxidation or chemical vapor deposition with a dielectric material to avoid the problem of "bird's beak".

The concept of replacing the standard PN junction isolation by using a diffused sidewall junction having an oxide layer is well established in the technology, for example, reported by Jones and Doo, "A Composite Isolator Junction Isolation", *Electrochemical Technology*, 5, 308 (1967). Further implementation of the use of an oxide layer in combination with substantially vertical trenches utilizing reactive ion etch (RIE) techniques is also described in *IBM Technical Disclosure Bulletin*, Vol. 20, No. 1, page 144 (June, 1977). Reference is also made to U.S. Pat. No. 3,386,865 which shows in greater detail the isolator junction isolation utilizing encapsulated oxide filled channel.

U.S. Pat. No. 3,966,577 describes an alternative form of forming a dielectric isolated structure having vertical sidewalls defining isolation trenches which are filled by thermal oxidation. This technique, requiring multiple heat treatment steps produces stress problems due to the thermal expansion coefficient differential in the various layers during heat treatment steps. The mismatch in thermal expansion is a device yield problem in deep dielectric isolation (DDI) techniques using $SiO_2$ irrespective of the deposition technique. The coefficient of thermal expansion for $SiO_2$ is $5.5 \times 10^{-7}$, per degree centigrade, while for Si in the order of $25-30 \times 10^{-7}/C°$. When processing at temperatures of about 1000° C., stresses result ultimately producing defects in the Si.

While solving the planar "bird's beak" problem, the present state of the art in DDI can be summarized as follows:

1. CVD oxide filling the trench may still result in a seam in the middle. This seam can impair the continuity of the metal line on top and can ultimately cause a failure in conduction.
2. CVD oxide filling the trench has a stress problem due to a mismatch in thermal expansion coefficient between the silicon dioxide ($SiO_2$) and the silicon (Si) during various subsequent heat processes. This stress results in defects in the Si around the trenched area and may extend into the device area.
3. CVD oxide filling the trenches are difficult to planarize. This is due to the fact that CVD tends to produce an oxide of about equal thickness inside the trench as well as outside.

SUMMARY OF THE INVENTION

In order to circumvent the deficiencies existing in this technology, it is an object of this invention to reduce the number of processing steps to achieve deep dielectric isolation while achieving improved isolation results.

An important object of this invention is to produce a deep dielectric isolation zone in a silicon substrate filled with a material having thermal coefficient of expansion characteristics matching those of the substrate.

Yet another object of this invention is to define a technique of glassing trenches to achieve DDI utilizing materials having matched thermal expansion coefficients with the substrate to avoid stress patterns that may occur in subsequent processing steps.

Still a further object of this invention is to define a technique of DDI utilizing reactive ion etching (RIE) for making trenches of uniform depth having substantially vertical sidewalls which are then filled utilizing sedimentation, centrifugation or other suitable glassing techniques.

These and other objects of this invention are accomplished by a method of providing for deep dielectric isolation in trenches formed utilizing RIE. Glass is deposited by sedimentation, centrifugation or spin-on techniques with heat treatment to fuse the glass particles into a continuous layer within the trench, final filling and smoothing accomplished utilizing CVD and RIE, if needed. The resulting structure, a trench filled with a glass material compatible with the substrate, offers deep dielectric isolation while not inducing stresses in the substrate during subsequent processing. The invention will be described in greater detail with reference to the drawings and description of the preferred embodiments as follows.

DESCRIPTION OF THE PREFERRED EMBODIMENTS

Figure 1:
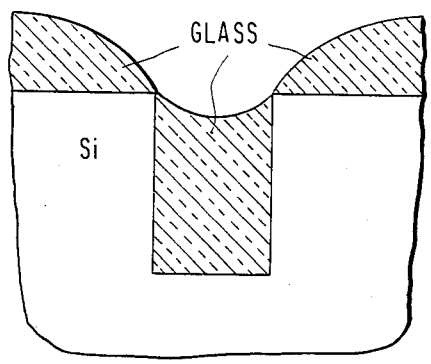
FIG. 1 is a cross-section of a trench for deep dielectric isolation in accordance with the first embodiment of this invention.

In accordance with the present invention, deep dielectric isolation in trenches is accomplished that avoids the mismatch of thermal expansion of a CVD oxide and the silicon substrate. The invention utilizes techniques of sedimentation, centrifugation or "spinning-on" of colloidal glass onto the silicon wafer. These glassing techniques per se are known in the technology, but have not been utilized for DDI. Centrifugation techniques are described in U.S. Pat. Nos. 3,212,921 and 3,212,929. Glass sedimentation is described in, Pliskin and Conrad, "Techniques for Obtaining Uniform Thin Glass Films on Substrates", *Electrochemical Technology*, Vol. 2, No. 7-8, pp. 196-200 (1964). Spin-on techniques are described in J. A. Amick, et al, J. Vac. Soc. Tech. 14, No. 5, p. 1053 (1977). In accordance with this known technology, a finely ground glass powder having properties providing a better match to silicon is employed. The glasses may be Corning Glass types 7723, 1715 or Pyrex types such as Corning 7740. Additional glasses such as a glass ceramic which crystalizes subsequent to fusion may be employed. Properties such as softening point and thermal expansion characteristics are preselected to match that of the substrate, generally silicon. The glass powder is ultrasonically mixed with a reasonably high dielectric constant liquid medium. Typically, such a liquid medium is isopropyl alcohol. Then, a lower dielectric constant fluid, such as ethyl acetate, is added and is ultrasonically mixed. By centrifugation techniques, coarse particles are then separated from this suspension. Centrifuging for several minutes at a medium rotating speed, for example, 500 G (gravitation) is utilized and the decanted liquid suspension obtained has fine particles of glass desirable for glass deposition process.

These steps may be repeated to obtain better separation and finer particles in the suspension which hereinafter will be defined as "the concentrate". The concentration levels of the concentrate are checked by centrifuging a known quantity of the liquid on a substrate at a high angular velocity. This may be equivalent to 2000 G, for a period of several minutes.

The liquid decanted and the glass suspension concentrate will then be coated onto the substrate in accordance with any of the above referenced techniques. It is understood that the substrate has been previously prepared by RIE techniques to define the trench areas to be filled with the concentrate.

The substrate is then fired for a few minutes at a temperature above the softening point of the glass to form a clear glazed glass film. The film thickness is measured to determine the concentration of the concentrate. The concentrate is then diluted with the proper quantity of ethyl acetate or ethyl acetate and isopropyl alcohol, or other organic liquid so that on subsequent sedimentation, the film thickness desired will be obtained.

A determination of the relative amount of isopropyl alcohol (methyl alcohol or acetone) to ethyl acetate (or some other fluid with similar properties) is dependent on the type of glass to be used. This relationship is known and, for example, described in U.S. Pat. Nos. 3,212,921; 3,212,929, and in Pliskin and Conrad, supra. A greater degree of uniformity and better adhesion between glass particles, for example to form a bridge or plug structure on the trench as described in some of the embodiments, can be obtained utilizing the "trichlor" technique in which a heavier and lower dielectric constant fluid, such as Trichloroethylene, is squirted underneath the gass suspension immediately prior to centrifiguation.

The present invention produces three different types of DDI following the appropriate glass coating. Each technique offers advantages over the conventional technique of utilizing CVD trenches to achieve isolation. As a precursor to each of the three methods, it is assumed, for example as shown in FIG. 1, that a wafer has trenches formed utilizing RIE with a depth typically in the range of 4 $\mu$m and width in the order of 2.5$\mu$. The glass to be used is then applied using the techniques identified herein.

In accordance with the first embodiment of this invention, the method employed utilizes filling the trench with glass having a softening point in the temperature range of 750°-1150° C. Such a glass may be Corning glass previously known as X760LZ and now denoted as type 7723. The glass can be formed by multiple firings of several layers of glass each equal or less to 1 $\mu$m or, alternatively, a single firing of a layer of glass having a thickness sufficient to fill the trench. The softening and densification of the deposited glass produces a desirable structure. It should be noted that the processing temperature is much higher than that used with prior glass centrifugation or sedimentation techniques. For example, in a typical prior use for discreet components, temperatures were limited by the melting in temperature of the contacts. In this invention such a restriction is removed. Note, however that some of the $SiO_2$ in the trench will dissolve in the glass raising its softening point subsequent to firing.

FIG. 1 is a schematic showing of a SEM photograph of the cross-section of a trench filled with Corning glass 7723. In accordance with this embodiment, two firings at 800° C. for ten minutes are employed with 1 $\mu$m added in each firing. Following these two applications, the structure is fired again at 950° C. for twenty minutes in air.

A variation of the first embodiment of this method employs a lift-off technique so that the surface glass is removed and the structure will be automatically planarized with the trench completely filled. A procedure to achieve this result employs the following steps with reference to FIG. 2.

Figure 2:
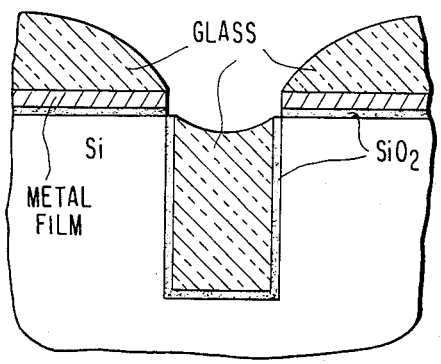
FIG. 2 is a cross-section of a trench having a $SiO_2$ layer in accordance with the second embodiment of this invention.

1. A thin film of thermal oxide $SiO_2$ is grown on the Si. A typical layer has a depth in the range of 1000 Å.
2. A thin metal film is deposited on top of the $SiO_2$ layer. For example, this metal could be Mo or W. The metal film preferably has a melting point greater than 1200° C. and is not reactive to either the thermal oxide or Si substrate. Another type of film may be used provided that it may be lifted off or burned off from the area of interest.
3. Deposit by CVD or plasma CVD a thin film of $Si_3N_4$ (around 1000 Å) to prevent the subsequent oxidation of the metal layer.
4. Utilizing photo techniques, such as photoresist, a window for the trench area is defined.
5. Employ RIE to remove metal or whatever film is used together with the $SiO_2$ and Si to form a deep trench having substantially vertical sidewalls.
6. A layer of $SiO_2$ is grown to form a lining inside the trench. This is shown in FIG. 2.
7. If necessary, a thin layer of $Si_3N_4$ may be used as a diffusion barrier.
8. Glassing in a manner previously described with reference to FIG. 1 is shown to form the composite structure shown in FIG. 2.
9. Should the glass on top of the metal film layer form balls, such that the metal surface is exposed, a simple metal etching procedure will remove metal film and lift-off the glass film. The resulting structure will be similar to that of FIG. 2 without the metal layer and the top glass layer. If the glass layer on top of the metal does not ball, then some area of the glass layer and the underlying silicon nitride can be etched off using a block off type mask. Then the metal layer will be etched off for the glass lift off.
10. The final structure may have a very shallow dimple on top of the filled trench. This can be filled and smoothed by CVD or by an additional glassing procedure. The depth of the dimple is in the range of 5000 Å or less and can easily be filled or alternatively, can be left as is.

Figure 3:
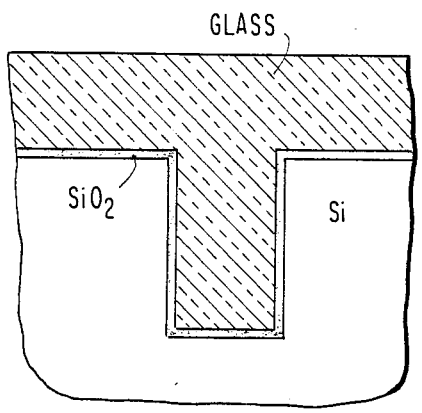
FIG. 3 shows a third embodiment of the present invention utilizing a modification of the embodiment of FIG. 2.

In accordance with the second preferred embodiment of this method, the lift-off technique is not employed but, based on experimental results, produces a structure shown in FIG. 3. FIG. 3 is a schematic representation of a SEM photograph of a structure having a $SiO_2$ lining on a silicon substrate. Glassing of sedimented Corning glass X760LZ without utilizing trichloroethylene is employed followed by firing the glass at 950° C. for twenty minutes in air.

The top glass surface may or may not be perfectly flat. Photoresist leveling and RIE planarization may be used to remove the glass layer on top. The technique is similar to existing CVD techniques; however, the surface topography of the glassing DDI results in a much better condition than that of the prior CVD method. Moreover, by utilizing the sedimented glass stress defects around the trench area are removed and mismatch of thermal expansion coefficient is also eliminated.

Figure 4:
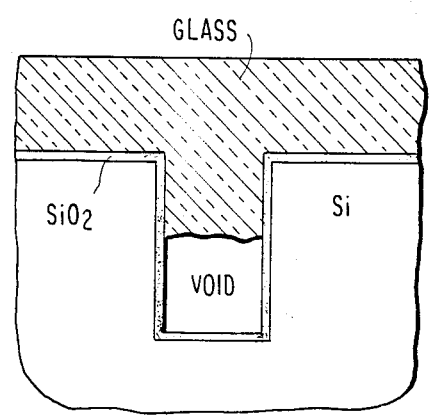
FIG. 4 shows a fourth embodiment of this invention utilizing a glass cap to plug the trench in accordance with a fourth embodiment.

A third method utilizes the "trichlor" technique described in the literature with respect to a new technique of forming a bridge or plug structure on the trench. FIG. 4 is a schematic representation of a SEM photograph showing a void in the trench plugged by an overlying sedimented glass layer. As shown in FIG. 4, a cap is formed to plug the trench. By utilizing the trichlor technique for glassing, multiple firing may be required. A high temperature, softening point, glass such as Corning 1715 or Corning 191CP or a combination of oxides is employed such that the combined thermal expansion coefficient matches that of Si. It is apparent that the plug structure shown in FIG. 4 is unique to this glassing method and cannot be produced utilizing prior CVD techniques. It produces air isolation DDI, a new structure not found in this technology.

Figure 5A:
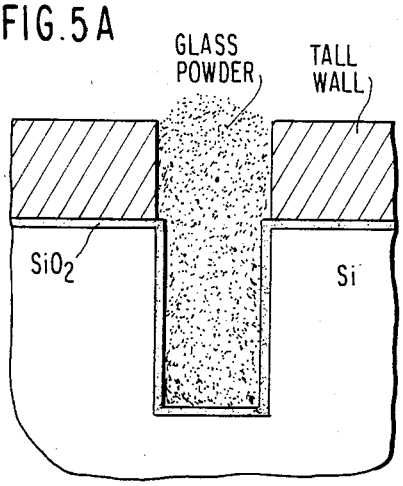
FIG. 5(A) and FIG. 5(B) show a fifth embodiment of this invention utilizing tall wall techniques which are subsequently removed to obtain a densified isolation trench.
Figure 5B:
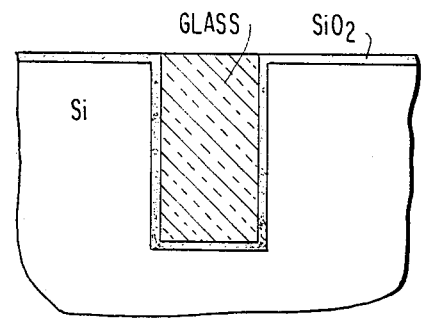

Finally, with respect to FIG. 5, a method is defined utilizing a temporary "tall sidewall" for trench definition. In accordance with this technique, a $SiO_2$ lining is provided and the material for the sidewall is either a metal or organic film that can be etched or dissolved or later burned. The height of the sidewall is determined by the depth of the trench and the densification factor of the glass to be used. A determination is made so that after firing and densification, the glass level will match that of the Si surface. The tall wall can then be etch dissolved or burned off. The final structure is shown in FIG. 5B. Any resulting glass particles on top of the tall wall may be mechanically brushed away if necessary prior to firing.

Accordingly, as shown in the methods defined herein by utilizing centrifugation, glass sedimentation, or spin-on techniques, the trenches are filled. The shapes and structures of the fill can be controlled by a method such a multiple firing, trichlor techniques, and softening point selection. The advantage of these techniques as opposed to prior CVD-DDI are most importantly a matching of thermal expansion, the possibility of lift-off on certain glass structures, and ease of planarization. It is apparent that modifications to these methods may be accomplished without departing from the essential scope thereof.

We claim:
1. A method for forming high density dielectric isolation in an integrated circuit structure comprising the steps of:
   forming trenches having substantially vertical sidewalls in a silicon substrate;
   filling the trenches with suspension containing particles of glass having a coefficient of thermal expansion substantially the same as the substrate;
   firing the structure at a temperature high enough to fuse the particles of glass and to form a continuous glass layer in the trenches; and
   simultaneously planarizing the surface of said integrated circuit structure.
2. The method of claim 1, wherein the step of forming trenches comprises reactive ion etching trenches in said substrate having sidewalls substantially perpendicular to a top surface of said substrate.
3. The method of claim 1, further comprising the steps of mixing a finely ground glass powder having properties matching said silicon substrate with a high dielectric constant fluid, adding a lower dielectric constant fluid and mixing, centrifuging to separate coarse particles from the resulting suspension and, decanting the resulting suspension.
4. The method of claims 1 or 3, wherein the step of filling the trenches comprises sedimenting multiple layers of said suspension into said trenches.
5. The method of claims 1 or 2, wherein the step of filling the trenches comprises sedimenting said suspension into said trenches.
6. The method of claims 1 or 2, wherein the step of filling the trenches comprises centrifugal deposition of said suspension into said trenches.

7. The method of claim 4, wherein the step of firing comprises firing the structure following each sedimentation of said suspension.

8. The method of claim 3, further comprising the step of applying a heavier and lower dielectric constant fluid underneath said suspension prior to centrifugation.

9. The method of claims 1 or 3, further comprising the steps of depositing a thin oxide film on said substrate prior to forming said trenches, forming said trenches by reactive ion etching and growing a thermal oxide lining for said trenches prior to filling by glass sedimentation.

10. The method of claim 9, further comprising the steps of depositing a film of a material not reactive to either said oxide film or said substrate on top of said oxide film prior to forming said trenches and, lifting off said film and any glass deposited thereon to planarize said surface.

11. The method of claim 10, further comprising the step of applying a thin layer of glass of chemical vapor deposition to smooth and fill said surface.

12. The method of claim 10, wherein said material is a metal film.

13. The method of claim 9, wherein the step of planarizing comprises the step of reactive ion etching to remove glass particles from said surface.

14. The method of claim 9, further comprising the step of applying a heavier and lower dielectric constant fluid in a sedimenting vessel and underneath said suspension prior to filling and wherein the step of filling results in a void in the bottom of said trenches with a plug of glass formed over said trench.

* * * * *